United States Patent [19]

Birrittella et al.

[11] Patent Number: 4,697,251
[45] Date of Patent: Sep. 29, 1987

[54] BIPOLAR RAM CELL

[75] Inventors: Mark S. Birrittella, Phoenix; James J. Stipanuk, Chandler, both of Ariz.

[73] Assignee: Motorola, Inc., Schaumburg, Ill.

[21] Appl. No.: 809,551

[22] Filed: Dec. 16, 1985

[51] Int. Cl.$^4$ .............................................. G11C 11/00
[52] U.S. Cl. ..................................... 365/154; 365/190
[58] Field of Search ............... 365/154, 156, 174, 189, 365/190, 202

[56] References Cited

U.S. PATENT DOCUMENTS 4,125,877 11/1978 Reinert ................................. 365/190
4,373,195 2/1983 Toyoda et al. ....................... 365/154

Primary Examiner—Joseph A. Popek
Attorney, Agent, or Firm—William E. Koch

[57] ABSTRACT

A memory cell is provided having reduced read and write times, and a large current differential between the standby mode and the read mode. A pair of cross-coupled NPN transistors have their emitters coupled to a lower word line and their collectors coupled to an upper word line by a first and second load, respectively. First and second NPN sense transistors each have a base coupled to the base of one of the cross-coupled transistors, an emitter coupled to a first and a second bit line, respectively, and a collector coupled to receive a supply voltage.

4 Claims, 1 Drawing Figure

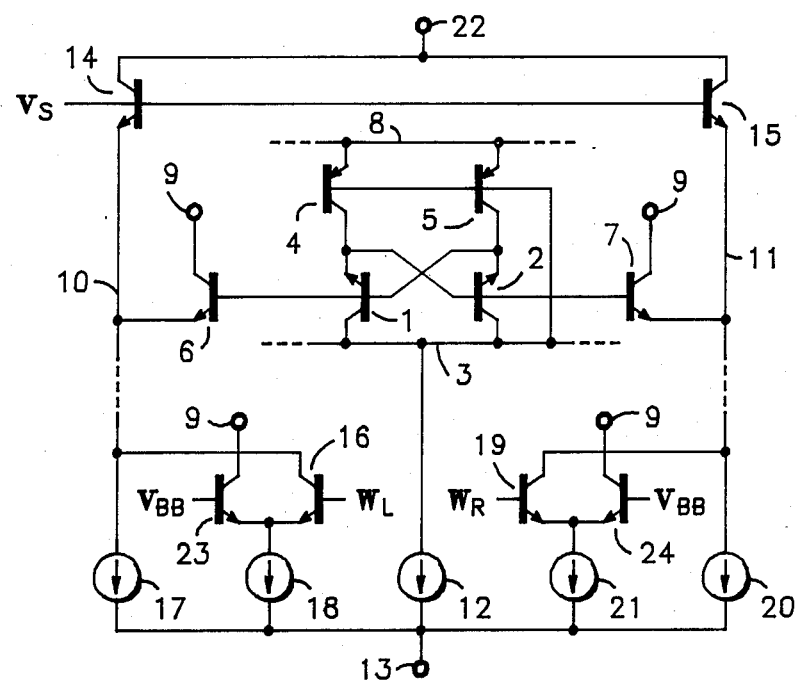

BIPOLAR RAM CELL

FIELD OF THE INVENTION

This invention relates generally to memory cells and, more particularly, to a bipolar memory cell having small read and write times, and a large current differential between the standby and read modes.

BACKGROUND OF THE INVENTION

Memory cells are circuits wherein information may be stored in a low current stand-by mode and may be written or read in a higher current mode. This current difference is referred to as dynamic range. A predetermined number of cells are located in a row between each of a plurality of upper and lower word lines and another predetermined number of cells are located in a column between a plurality of bit lines. In other words, each cell is uniquely coupled between a combination of word lines and bit lines.

Typically, a row of cells is selected when increased voltage is supplied to the upper word line. A particular cell in that row is read by a sense amplifier coupled to the bit lines. A first read current through one bit line flows directly to the sense amplifier. A second read current through the other bit line flows through one side of the memory cell to the upper word line. When a cell is written, the first read current is directed through the cell and the second read current is directed to the sense amplifier.

Access time refers to the time required to raise the voltage on the upper word line of a selected row of cells. This must be accomplished before the write signal causes current to flow through the appropriate bit line to write the cell. As memories are manufactured with more cells within the array, either a larger current, i.e., higher power dissipation, is required to hold the deselected row down or a larger load resistor, i.e., slower access time, is needed.

One convential memory cell comprises a cross-coupled pair of multi-emitter NPN transistors operating as a latch. Each multi-emitter NPN transistor has a first emitter connected to a lower word line, and a second emitter connected to a first and second bit line, respectively. The collector of each are coupled to an upper word line by a first and second resistive load, respectively. This resistive load, for instance, comprises a resistor and a Schottky diode in parallel. This Schottky-clamped resistor load arrangement is used to implement the non-linear resistance required to maintain reasonable cell differential voltage under both the low current stand-by mode and the higher current read/write mode. Cell differential voltage is designed at typically 350 millivolts during standby and provides sufficient noise immunity. This differential voltage is usually obtained with a large resistor of approximately 30K ohms. However, this passive load requires a relative high current in the standby mode. Furthermore, the transistors of this cell can be saturated which results in a large storage charge in the cell.

Another conventional memory cell comprises a cross coupled pair of NPN transistor operated in the inverse mode. An emitter of each is connected to a lower word line, a collector is connected to each other's base and to the collector of a first and second PNP load transistor, respectively. First and second sense transistors have their bases connected to the base of a respective one of the cross-coupled pair, their collectors connected to the collectors of the first and second PNP load transistors, respectively, and their emitters connected to a first and second bit line, respectively. The emitters and bases of the PNP load transistors are connected to an upper word line and the lower word line, respectively. A problem existing with this cell is that the respective multi-emitter transistor and load transistor will saturate in the "on" state, resulting in a large storage charge within the memory cell. This causes the cell to respond slowly to a write current.

Another previously known cell, typically called an SCR cell, comprises cross-coupled first and second multi-emitter NPN transistors, each having a first emitter connected to a lower word line, and a second emitter connected to a first and second bit line, respectively. The collector of the first cross-coupled multi-emitter NPN transistor is connected to the base of the second cross-coupled multi-emitter NPN transistor, and is connected to the base and collector of a first and second PNP load transistor, respectively. The collector of the second cross-coupled multi-emitter NPN transistor is connected to the base of the first cross-coupled multi-emitter NPN transistor, and is connected to the base and collector of the second and first PNP load transistor, respectively. The emitters of the PNP load transistors are connected to an upper word line. A problem existing with this cell, as with the previously described cell, is that the respective multi-emitter transistor and load transistor will saturate in the "on" state, resulting in large storage charge. This causes the cell to respond slowly to a write current.

Another conventional memory cell comprises cross-coupled first and second NPN transistors operated in the inverse mode. An emitter of each is connected to a lower word line and a collector is connected to the other's base and to the collector of a first and second PNP load transistor, respectively. A third and fourth NPN transistor each have their emitters connected to a first and second bit line, respectively, a base connected to the base of the first and second NPN transistors, respectively, and a collector connected together and to the bases of first and second PNP load transistors. The emitters of the PNP load transistors are coupled to an upper word line. A problem existing with this cell is that a write current supplied to the emitter of either the third or fourth NPN transistor adds to the base current of the first or second NPN transistor, respectively. This base current is beta multiplied by the PNP transistor, which sources current into the respective third or fourth NPN transistor which is trying to be turned off. This creates a SCR situation in which the cell may not write.

All of the above previously known memory cells have certain characteristics giving it an advantage over another. However, all of these previously known memory cells have a fundamental charge storage problem caused by large read/write currents flowing in the clamping diode of a resistor loaded cell and the injector of a PNP load cell. This charge storage results in long write pulse width and long write recovery times for these cells.

Therefore, a memory cell is needed having small read and write times and a large current dynamic range in which the large bit line current does not flow through the cross coupled pair and load devices.

SUMMARY OF THE INVENTION

Accordingly, it is an object of the present invention to provide an improved memory cell.

Another object of the present invention is to provide an improved memory cell having a fast write time.

Yet another object of the present invention is to provide an improved memory cell having a fast read time.

Still another object of the present invention is to provide an improved memory cell having a large dynamic range.

In carrying out the above and other objects of the invention in one form, there is provided an improved memory circuit including a pair of cross-coupled NPN transistors operated in an inverse mode an having their emitters coupled to a lower word line and their collectors coupled to an upper word line by a first and second load, respectively. First and second NPN transistors each have a base coupled to the base of one of the cross-coupled transistors, an emitter coupled to a first and a second bit line, respectively, and a collector coupled to receive a supply voltage.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the invention.

DETAILED DESCRIPTION OF THE INVENTION

Referring to the single FIGURE, a memory cell in accordance with the present invention is shown which is suitable to be fabricated in monolithic integrated circuit form as well as with discrete components. In actuality, a plurality of memory cells are coupled in the manner described below as reflected by the dotted lines. NPN transistors 1 and 2 operate in the inverse mode having their emitters connected to lower word line 3 and to the bases of current source PNP transistors 4 and 5. Transistors 4 and 5 are illustrated in the figure as being connected in the inverse mode, i.e., their collectors being connected to word line 3, where in actuallity, their emitters are connected to word line 3. The collectors of transistors 1 and 2 are connected to each other's base, to the bases of sense NPN transistors 6 and 7, respectively, and to the collectors of transistors 4 and 5, respectively. Transistors 4 and 5 each have an emitter connected to upper word line 8. Transistors 6 and 7 each have a collector connected to supply voltage terminal 9 and an emitter connected to bit lines 10 and 11, respectively. Current source 12 is coupled between lower word line 3 and supply voltage terminal 13 in a manner known to those skilled in the art for establishing standby current I. Additional memory cells may be coupled between bit lines 10 and 11 forming a column of memory cells and between word lines 3 and 8 to form a row of memory cells.

Bit line clamp transistors 14 and 15 have their collectors connected to supply voltage terminal 22, their bases coupled for receiving sense voltage $V_S$, and their emitters connected to bit lines 10 and 11, respectively. Terminal 22 may have the same potential as terminal 9. Transistor 16 has a collector connected to bit line 10 and coupled to supply voltage terminal 13 by current source 17, an emitter coupled to supply voltage terminal 13 by current source 18, and a base coupled for receiving write signal $W_L$. Transistor 19 has a collector connected to bit line 11 and coupled to supply voltage terminal 13 by current source 20, an emitter coupled to supply voltage terminal 13 by current source 21, and a base coupled for receiving write signal $W_R$. Transistor 23 has an emitter connected to the emitter of transistor 16, a collector connected to terminal 9, and a base coupled for receiving voltage $V_{BB}$. Transistor 24 has an emitter connected to the emitter of transistor 19, a collector connected to terminal 9, and a base coupled for receiving voltage $V_{BB}$.

The memory cell described herein operates in the typical latching arrangement as understood by those skilled in the art. However, in conventional memory cells, if the bit line sense transistor saturates in the standby mode, the emitter connected to the bit line acts as a current source providing uncontrollable current to the bit line. Most of the current through bit lines 10 or 11 flowing into the emitters of transistors 6 or 7 will be steered to supply voltage terminal 9. This allows for the use of a large current to discharge parasitic bit line capacitance without the current going into the cell and creating excessive charge storage.

The memory cell described herein is selected by increasing the voltage of upper word line 8. The bases of transistors 14 and 15 are held at the same potential $V_S$ in the stand-by, read, or write modes. In the read mode, assuming the left side of the cell is written, current from bit line 10 will flow through transistor 6 to terminal 9, and current from bit line 11 will flow through transistor 15 to terminal 22. The voltage on the base of transistor 2 is then much less than the voltage on the base of transistor 1; therefore, transistor 1 is on and is forced to have a beta of one and will saturate. Current would be flowing through transistors 4, 5 and 1 to word line 3. No current would flow through transistors 2 and 7.

To write the right side of the cell, write signal $W_L$ goes high, providing additional current to bit line 10 through transistor 16. This additional current flows to transistor 6 causing its base current to become larger than the collector current of transistor 5. Therefore, the voltage on the base of transistor 1 lowers and transistor 1 turns off. The collector voltage of transistor 1 rises, thereby turning on transistors 2 and 7.

Since transistors 6 and 7 are operated in the forward mode, no significant storage charge is created when the bit line current flows through them. The possibility of latch-up during writing present in the previously known art is also eliminated.

By now it should be appreciated that there has been provided a bipolar memory cell having reduced read and write times, and a large current dynamic range.

What is claimed is:

1. A memory cell having a first bit line, a second bit line, a first word line, and a second word line, comprising:
   a voltage terminal;
   a first load;
   a second load;
   a pair of latchable cross-coupled transistors having their emitters coupled to said second word line, their collectors coupled to said first word line by said first and second loads, respectively, and their bases coupled to each other's collector;
   first means coupled between said voltage terminal and said first bit line and coupled to said base of one of said pair of latchable cross-coupled transistors for sinking current from said base of said one of said pair of latchable cross-coupled transistors, wherein a voltage on said voltage terminal is greater in magnitude than the voltage on said first bit line; and second means coupled between said voltage terminal and said second bit line and coupled to said base of the other of said pair of latchable crosscoupled transistors for sinking current from said base of said other of said pair of latchable cross-coupled transistors, wherein a voltage on said voltage terminal is greater in magnitude than the voltage on said second bit line.

2. The memory cell according to claim 1 wherein said first and second means each comprise a transistor, each having a collector coupled to said voltage terminal, an emitter coupled to said first and second bit lines, respectively, and a base coupled to said base of one of said pair of latchable cross-coupled transistors.

3. The memory cell according to claim 2 wherein said first and second load comprise a third and fourth transistor, each having an emitter coupled to said first word line, a base coupled to said second word line, and a collector coupled to the base of the other of said pair of latchable cross-coupled transistors.

4. A memory cell having a first bit line, a second bit line, a first word line, and a second word line, comprising:

a first transistor having a base, a collector, and an emitter, said collector coupled to said second word line;

a second transistor having a base, a collector, and an emitter, said base coupled to said emitter of said first transistor, said collector coupled to said second word line, and said emitter coupled to said base of said first transistor;

a third transistor having a base, a collector, and an emitter, said base coupled to said second word line, said collector coupled to said base of said second transistor, and said emitter coupled to said first word line;

a fourth transistor having a base, a collector, and an emitter, said base coupled to said second word line, said collector coupled to said base of said first transistor, and said emitter coupled to said first word line;

a fifth transistor having a base, a collector, and an emitter, said base coupled to said base of said first transistor, said collector coupled to receive a supply voltage, and said emitter coupled to said first bit line, wherein said supply voltage is greater in magnitude than the voltage on said first bit line; and a sixth transistor having a base, a collector, and an emitter, said base coupled to said base of said second transistor, said collector coupled to receive said supply voltage, and said emitter coupled to said second bit line, wherein said supply voltage is greater in magnitude than the voltage on said second bit line.

* * * * *